United States Patent
Song et al.

(10) Patent No.: US 8,489,220 B2
(45) Date of Patent: Jul. 16, 2013

(54) VARIABLE TAPE FEEDER

(75) Inventors: Jun-Keun Song, Seongnam-si (KR);
Il-Young Song, Seongnam-si (KR);
Tae-Sung Jang, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 603 days.

(21) Appl. No.: 12/723,230

(22) Filed: Mar. 12, 2010

(65) Prior Publication Data
US 2010/0256819 A1   Oct. 7, 2010

(51) Int. Cl.
G05B 11/01 (2006.01)
G06F 19/00 (2006.01)
G01M 1/38 (2006.01)
B65B 21/02 (2006.01)
B23Q 15/00 (2006.01)
G03B 1/24 (2006.01)
B65H 20/24 (2006.01)

(52) U.S. Cl.
USPC ............ 700/114; 414/416.02; 414/416.05; 414/416.09; 700/13; 700/275; 226/29; 226/76; 226/112

(58) Field of Classification Search
CPC ................... B65H 37/002; H05K 13/0417
USPC ............ 700/13, 114, 275; 226/4, 36, 112, 226/29, 76; 414/416.02, 416.05, 416.09
See application file for complete search history.

(56) References Cited

U.S. PATENT DOCUMENTS

| | | | | |
|---|---|---|---|---|
| 4,768,915 A | * | 9/1988 | Fujioka | 414/416.08 |
| 5,676,556 A | * | 10/1997 | Yamaguchi et al. | 439/157 |
| 6,244,429 B1 | * | 6/2001 | Drewitz et al. | 198/836.3 |
| 7,143,301 B2 | * | 11/2006 | Pearce et al. | 713/401 |
| 7,530,442 B2 | * | 5/2009 | Gerke et al. | 198/402 |
| 8,079,396 B2 | * | 12/2011 | Rachkov | 156/539 |
| 2005/0216109 A1 | * | 9/2005 | Radigan et al. | 700/97 |
| 2006/0162868 A1 | * | 7/2006 | Ricketson | 156/584 |
| 2007/0124618 A1 | * | 5/2007 | Aguilar et al. | 713/322 |
| 2008/0224379 A1 | * | 9/2008 | McNamara | 270/58.09 |

FOREIGN PATENT DOCUMENTS

| | | | |
|---|---|---|---|
| JP | 06-029691 A | | 2/1994 |
| JP | 08-023190 A | | 1/1996 |
| JP | 11-284390 A | | 10/1999 |
| JP | 2000-013091 A | | 1/2000 |
| JP | 2000-269686 A | | 9/2000 |
| JP | 2005-093670 A | | 4/2005 |
| JP | 2006-013112 A | | 1/2006 |
| JP | 2008-147704 A | | 6/2008 |
| KR | 2002049317 A | * | 6/2002 |
| KR | 10-2005-0087960 A | | 9/2005 |
| KR | 10-2005-0120147 A | | 12/2005 |

* cited by examiner

*Primary Examiner* — Kavita Padmanabhan
*Assistant Examiner* — Darrin Dunn
(74) *Attorney, Agent, or Firm* — Sughrue Mion, PLLC

(57) ABSTRACT

A variable tape feeder is provided. The variable tape feeder includes a frame having an accommodating section and a component feeding section on a transfer path that transfers a carrier tape having components packaged with a cover tape. Width adjusters for the transfer path, the accommodating section, and the component feeding section are installed respectively on the transfer path, accommodating section, and component feeding section to adjust widths thereof according to widths of the carrier tape, the accommodating section, and the component feeding section, respectively. Width sensors for the transfer path, the accommodating section, and the component feeding section detect widths adjustment of the transfer path, the accommodating section, and the component feeding section width adjusters, respectively. A controller outputs a response signal in response to signals detected by the respective sensors installed in the component feeding section and the accommodating section.

17 Claims, 13 Drawing Sheets

VARIABLE TAPE FEEDER

CROSS-REFERENCE TO RELATED APPLICATION

This application claims priority from Korean Patent Application No. 10-2009-0028070, filed Apr. 1, 2009, the contents of which are hereby incorporated herein by reference in their entirety.

BACKGROUND

1. Field

Exemplary embodiments relate to a variable tape feeder, and more particularly, to a variable tape feeder capable of adjusting a width of a transfer path formed therein as well as widths of a component feeding section and an accommodating section provided on the transfer path according to the width of a carrier tape transferred along the transfer path.

2. Description of Related Art

In general, tape feeders are installed on component mounters called chip mounters in the form of a cartridge to feed a predetermined number of components to the component mounters, and may be variously classified as 8 mm, 12 mm, 16 mm, 24 mm, 32 mm, 44 mm, 56 mm, and 88 mm tape feeders according to the width of a carrier tape.

The tape feeders include combination tape feeders in which two carrier tapes having different widths are compatible with each other. For example, the 12 mm carrier tape may be fed to the 16 mm tape feeder. Similarly, the 24 mm, 44 mm and 72 mm carrier tapes may be fed to the 32 mm, 56 mm and 88 mm tape feeders, respectively. In other words, the combination tape feeders are designed to be able to use two carrier tapes having adjacent widths.

Further, the component mounters are machines that automatically mount semiconductor chips fed by the tape feeder to preset locations of a printed circuit board (PCB), and mount various components fed in various methods on the PCB using a suction nozzle operated by a robot. Here, the tape feeder is used to feed relatively small components packaged in a carrier tape to the component mounter.

The carrier tape feeding the components through the tape feeder includes a base tape in which relatively small components are packaged at regular intervals, and a cover tape covering the base tape in order to protect the components, and is wound on a reel. The tape feeder feeds the components packaged at regular intervals to the component mounter while removing the cover tape from the base tape of the carrier tape wound on the reel.

The component mounter mounts the components on the PCB using the robot-operated suction nozzle to suck or pick up the components, which are held in the base tape of the carrier tape with the cover tape removed, and then transferring the components to the PCB.

This tape feeder is disclosed in Korean Patent Publication No. 2007-039322. The disclosed tape feeder includes a frame having a transfer path along which a carrier tape is transferred. The frame is coupled with a ratchet gear and a sprocket, both of which are coaxially coupled to each other. The ratchet gear is coaxially coupled with a pivotable pusher lever. The pusher lever is operated by multiple links and a driving cylinder.

The pusher lever is coupled with a push pawl through a torsion spring. The push pawl is disengaged from any tooth of the ratchet gear when being moved forward by one of the links, and is engaged with the tooth of the ratchet gear when being moved backward by the link, thereby rotating the ratchet gear at a predetermined angle. A stop pawl is pivotably installed on the frame such that the ratchet gear can stop rotating at a position where the ratchet gear is rotated by the push pawl. The stop pawl is coupled with a tension spring providing elasticity to be able to be engaged with the tooth of the ratchet gear.

Thus, the forward and backward movement of the link causes the push pawl to rotate the ratchet gear at a predetermined angle, so that the stop pawl is disengaged from the tooth of the ratchet gear, and then is engaged with the next tooth of the ratchet gear.

When the ratchet gear is rotated, the sprocket is also rotated. Thus, the carrier tape is advanced pitch by pitch, and the cover tape thereof is removed and discharged backward. Then, the components held in the base tape of the carrier tape are fed to the component mounter.

In order to discharge the cover tape backward, a first rotator and a second rotator engaged with the first rotator are provided. The cover tape is interposed between the first and second rotators. Thus, the first and second rotators are rotated to discharge the cover tape to an accommodating section having a predetermined space. Here, the tape feeder can be configured to drive the sprocket, the first rotator, and the second rotator using a driving motor without using respective driving cylinders.

Here, the tape feeder designed to feed only a single width of carrier tape causes no trouble when the carrier tape is transferred. However, the tape feeder designed to be able to use at least two widths of carrier tape has an extra space along the transfer path, and thus suffers from deflection of the carrier tape.

For this reason, the carrier tape is not smoothly fed along the transfer path of the tape feeder, and the components are not accurately fed to the head of a component feeding section. In other words, a suction position of the components varies causing a pickup error. Further, the cover tape is entangled in the accommodating section to which the cover tape is discharged, and thus fails to be guided toward a door.

Furthermore, in the case in which the cover tape is entangled on the way to the door, the first and second rotators for discharging the cover tape are loaded. In the worst case, the cover tape is not discharged and may cause setbacks in production.

SUMMARY

Exemplary embodiments provide a variable tape feeder capable of adjusting widths of a transfer path formed therein, a component feeding section, and an accommodating section provided on the transfer path according to the width of a carrier tape transferred along the transfer path, detecting such adjustment to determine whether the widths are equal to each other, and displaying a result of the determination, thereby improving convenience of the width adjustment and productivity.

According to an aspect of an exemplary embodiment, there is provided a variable tape feeder including: a frame including a transfer path that transfers a carrier tape along a transferring direction; a transfer path width adjuster that is installed on the transfer path to adjust a width of the transfer path according to a width of the carrier tape; a transfer path width sensor that detects a width adjustment of the transfer path width adjuster; and a controller that receives a signal indicative of the detected width adjustment from the transfer path width sensor and outputs the width adjustment in response to the signal.

The transfer path width adjuster may be a plate having a predetermined thickness and adjusts the width of the transfer path according to a fixed position. The transfer path width sensor may detect a position of the transfer path width adjuster to detect the width adjustment.

Further, the transfer path width adjuster may include at least one first guide protrusion extending in a widthwise direction of the transfer path perpendicular to the transferring direction. The frame may include at least one first guide hole into which the first guide protrusion is slidably inserted in the widthwise direction.

Also, the transfer path width adjuster may include a first position determining member that determines a position of the transfer path width adjuster according to the width adjustment. The first position determining member may be pivotable relative to the frame, and include a first positioning protrusion extending in the transferring direction on one side of the first position determining member and in contact with the transfer path width adjuster, and a first elastic member providing elasticity on another side of the first position determining member to keep the transfer path width adjuster positioned.

In addition, the frame may include a first installing section defined by a recess on the transfer path, and the first position determining member and the transfer path width sensor are installed in the first installing section adjacent to the transfer path.

According to an aspect of another exemplary embodiment, there is provided a variable tape feeder including: a frame including a transfer path that transfers a carrier tape along a transferring direction, and an accommodating section; an accommodating section width adjuster that is installed in the accommodating section to adjust a width of the accommodating section according to a width of the cover tape; an accommodating section width sensor that detects a width adjustment of the accommodating section width adjuster; and a controller that receives a signal indicative of the detected width adjustment from the accommodating section width sensor and outputs the width adjustment in response to the signal.

The accommodating section width adjuster may be a plate having a predetermined thickness and adjust the width of the accommodating section according to a fixed position. The accommodating section width sensor may detect a position of the accommodating section width adjuster to detect the width adjustment.

Further, the accommodating section width adjuster may include at least one second guide protrusion extending in a widthwise direction of the accommodating section perpendicular to the transferring direction. The frame may include at least one second guide hole into which the second guide protrusion is slidably inserted the widthwise direction.

Also, the accommodating section width adjuster may include a second position determining member that determines a position of the accommodating section width adjuster according to the width adjustment. The second position determining member may be pivotable relative to the frame, and include a second positioning protrusion extending in the transferring direction on one side of the second position determining member and in contact with the accommodating section width adjuster, and a second elastic member providing elasticity on another side of the second position determining member to keep the accommodating section width adjuster positioned.

In addition, the frame may include a second installing section defined by a recess in the accommodating section, and the second position determining member and the accommodating section width sensor are installed in the second installing section adjacent to the accommodating section.

According to an aspect of another exemplary embodiment, there is provided a variable tape feeder including: a frame including a transfer path that transfers a carrier tape along a transferring direction, and a component feed section; a component feeding section width adjuster that is installed in the component feeding section to adjust a width of the component feeding section according to a width of the carrier tape; a component feeding section width sensor that detects a width adjustment of the component feeding section width adjuster; and a controller that receives a signal indicative of the detected width adjustment from the component feeding section width sensor and outputs the width adjustment in response to the signal.

The component feeding section width adjuster may be a plate having a predetermined thickness and adjust the width of the component feeding section according to a fixed position. The component feeding section width sensor may detect a position of the component feeding section width adjuster to detect the width adjustment.

Further, the component feeding section width adjuster may be in contact with an inner sidewall of the component feeding section. The width adjustment of the component feeding section may be determined based on a thickness of the component feeding section width adjuster.

The frame may include a third installing section defined by a recess on the transfer path, wherein the component feeding section width sensor is installed in the third installing section.

Further, the component feeding section width adjuster may include a fixing section having a flat bottom surface. The frame may include at least one locking member that engages the fixing section of the component feeding section width adjuster to prevent removal of the component feeding section width adjuster. The fixing section of the component feeding section width adjuster may include a locking recess in which the locking member is disposed.

In addition, the locking member may include a hook, and a locking elastic member providing a predetermined elastic force to the locking member.

According to an aspect of another exemplary embodiment, there is provided a variable tape feeder including: a frame including a transfer path that transfers a carrier tape along a transferring direction, an accommodating section that accommodates the cover tape which is removed from the carrier tape before the components are fed, and a component feeding section that feeds the components to a component mounter; a transfer path width adjuster that is installed on the transfer path to adjust a width of the transfer path according to a width of the carrier tape; a transfer path width sensor that detects a transfer path width adjustment of the transfer path width adjuster; an accommodating section width adjuster installed in the accommodating section to adjust a width of the accommodating section according to a width of the cover tape; an accommodating section width sensor that detects an accommodating section width adjustment of the accommodating section width adjuster; a component feeding section width adjuster installed in the component feeding section to adjust a width of the component feeding section according to a width of the carrier tape; a component feeding section width sensor that detects a component feeding section width adjustment of the component feeding section width adjuster; and a controller that receives a signal indicative of the transfer path width adjustment from the transfer path width sensor, a signal indicative of the accommodating section width adjustment from the accommodating section width sensor, and a signal indicative of the component feeding section width adjustment from the component feeding section sensor, and outputs the transfer path width adjustment, the accommodating section width adjustment, and the component feeding section width adjustment in response to the signals.

The controller may determine whether the respective widths of the transfer path, the accommodating section and the component feeding section are equal to each other in response to the respective signals respectively detected by the transfer path width sensor, the accommodating section width sensor, and the component feeding section width sensor, and may output results of the determination together.

BRIEF DESCRIPTION OF THE DRAWINGS

The above and/or other aspects will become apparent and more readily appreciated from the following detailed description of the exemplary embodiments, taken in conjunction with the accompanying drawings of which.

DETAILED DESCRIPTION OF THE EXEMPLARY EMBODIMENTS

A variable tape feeder according to the inventive concept will be described below in detail with reference to the accompanying drawings. It should be understood that various aspects of the drawings may be exaggerated for clarity.

It should be noted that the terms and words used in the specification and claims pertaining to the inventive concept are not to be construed as being restricted to ordinary and customary meanings or dictionary definitions.

Figure 1:
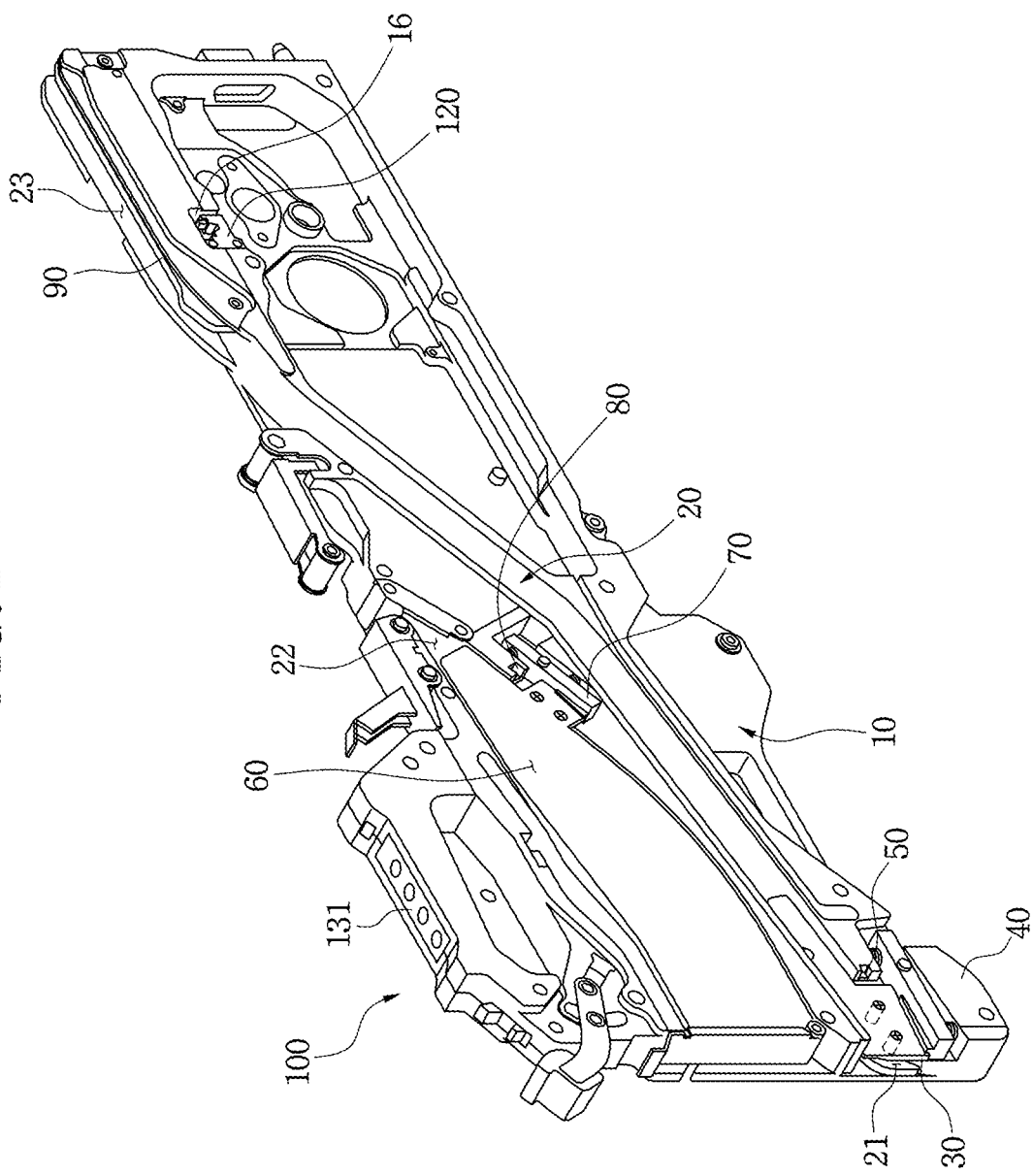
FIG. 1 is a perspective view of a variable tape feeder according to an exemplary embodiment.
Figure 2:
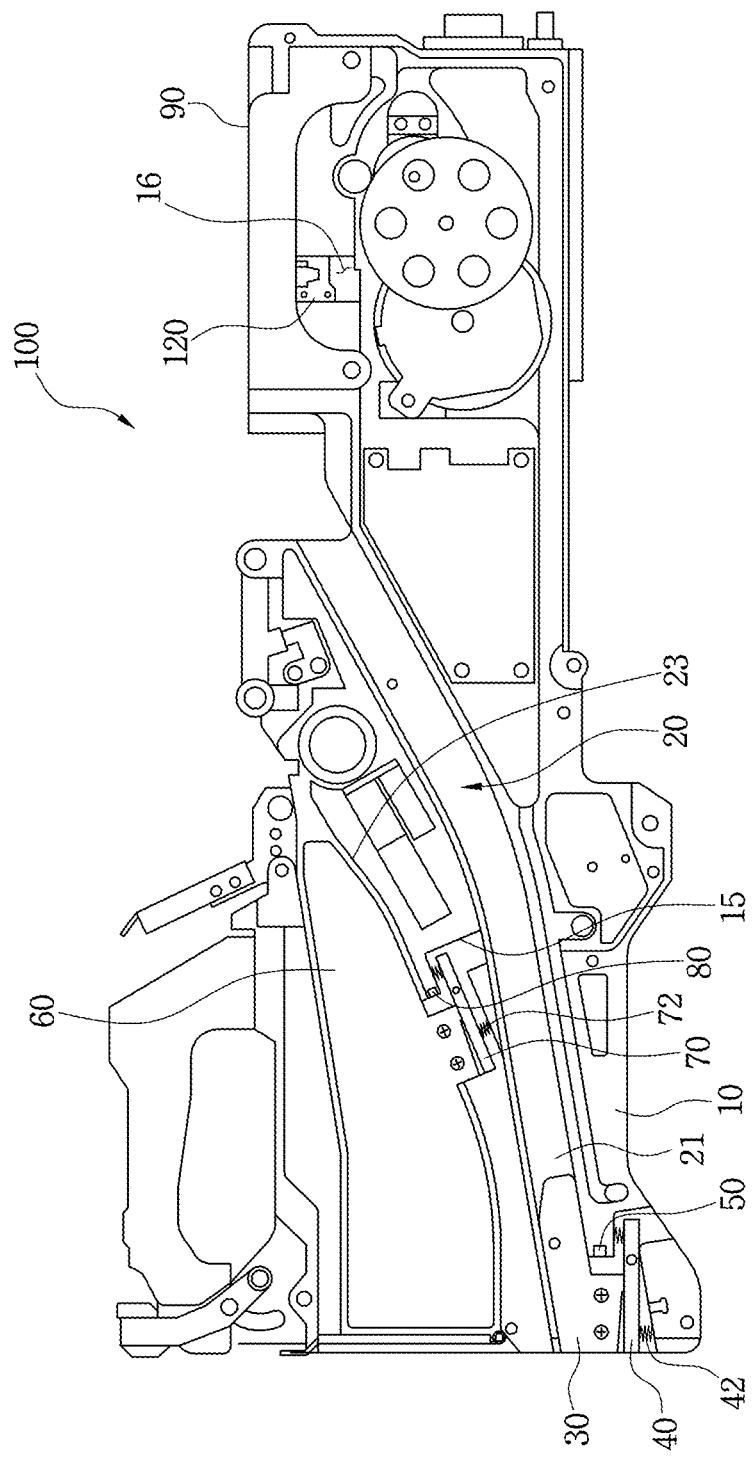
FIG. 2 is a side view of a variable tape feeder according to an exemplary embodiment.
Figure 3:
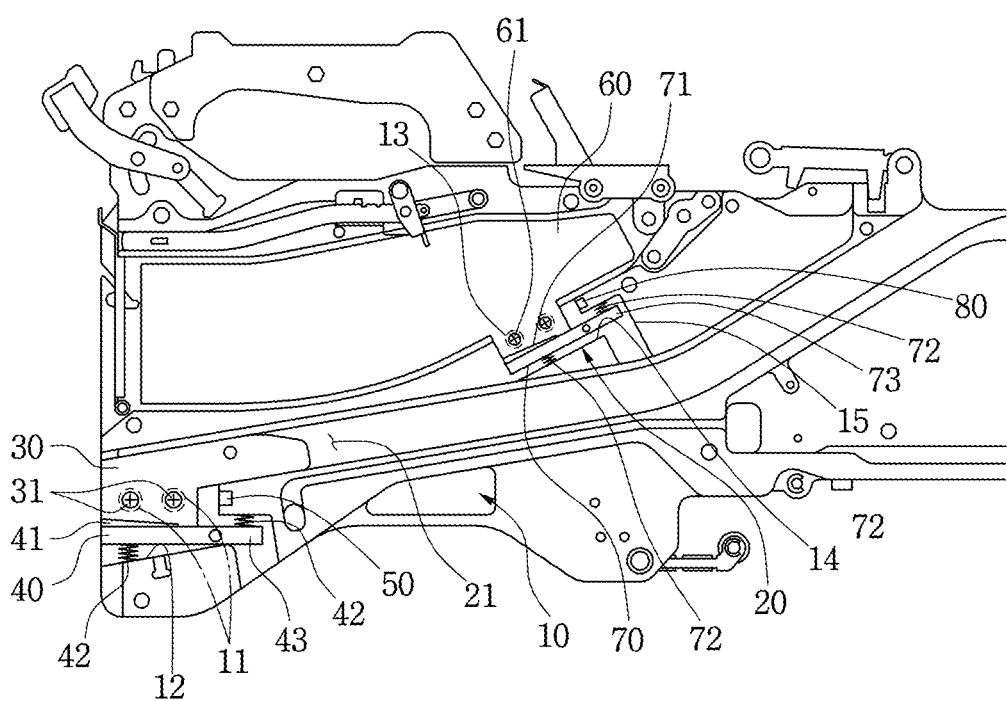
FIG. 3 is an enlarged view of a transfer path and an accommodating section of the transfer path in a variable tape feeder according to an exemplary embodiment.
Figure 4:
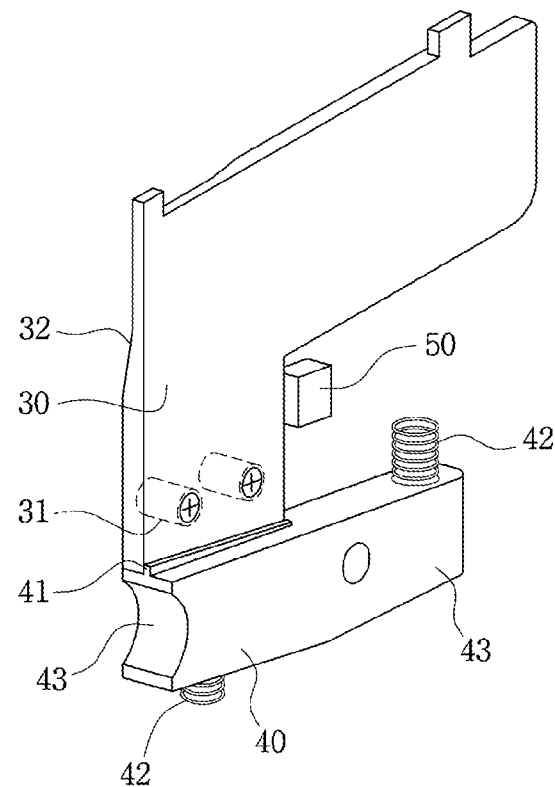
FIGS. 4 through 6 are perspective views illustrating operation of a transfer path width adjuster installed on a transfer path in a variable tape feeder according to an exemplary embodiment.
Figure 5:
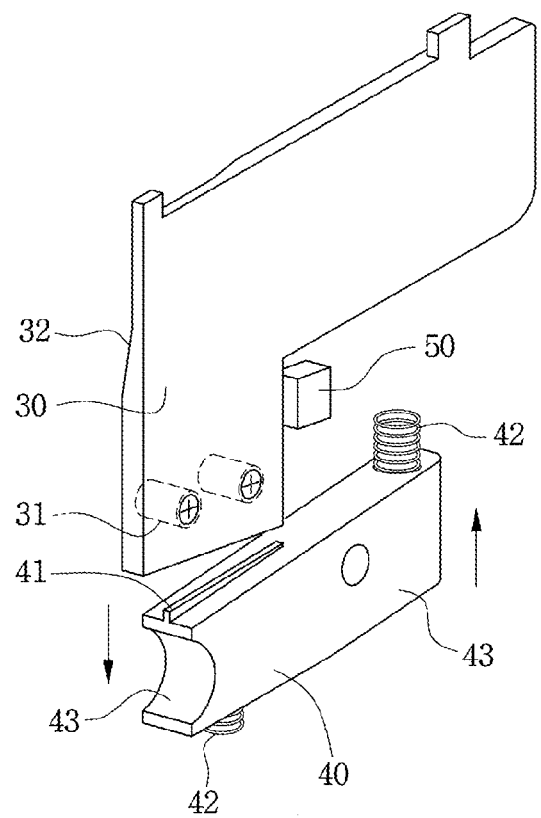
Figure 6:
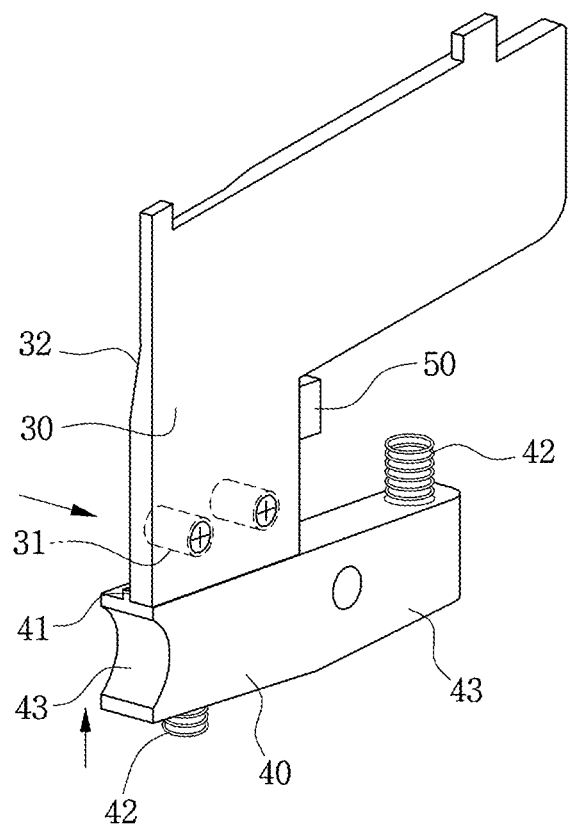

FIG. 1 is a perspective view of a variable tape feeder according to an exemplary embodiment. FIG. 2 is a side view of a variable tape feeder according to an exemplary embodiment. FIG. 3 is an enlarged view of a transfer path and an accommodating section of the transfer path in a variable tape feeder according to an exemplary embodiment. FIGS. 4 through 6 are perspective views illustrating operation of a transfer path width adjuster installed on a transfer path in a variable tape feeder according to an exemplary embodiment.

Figure 7:
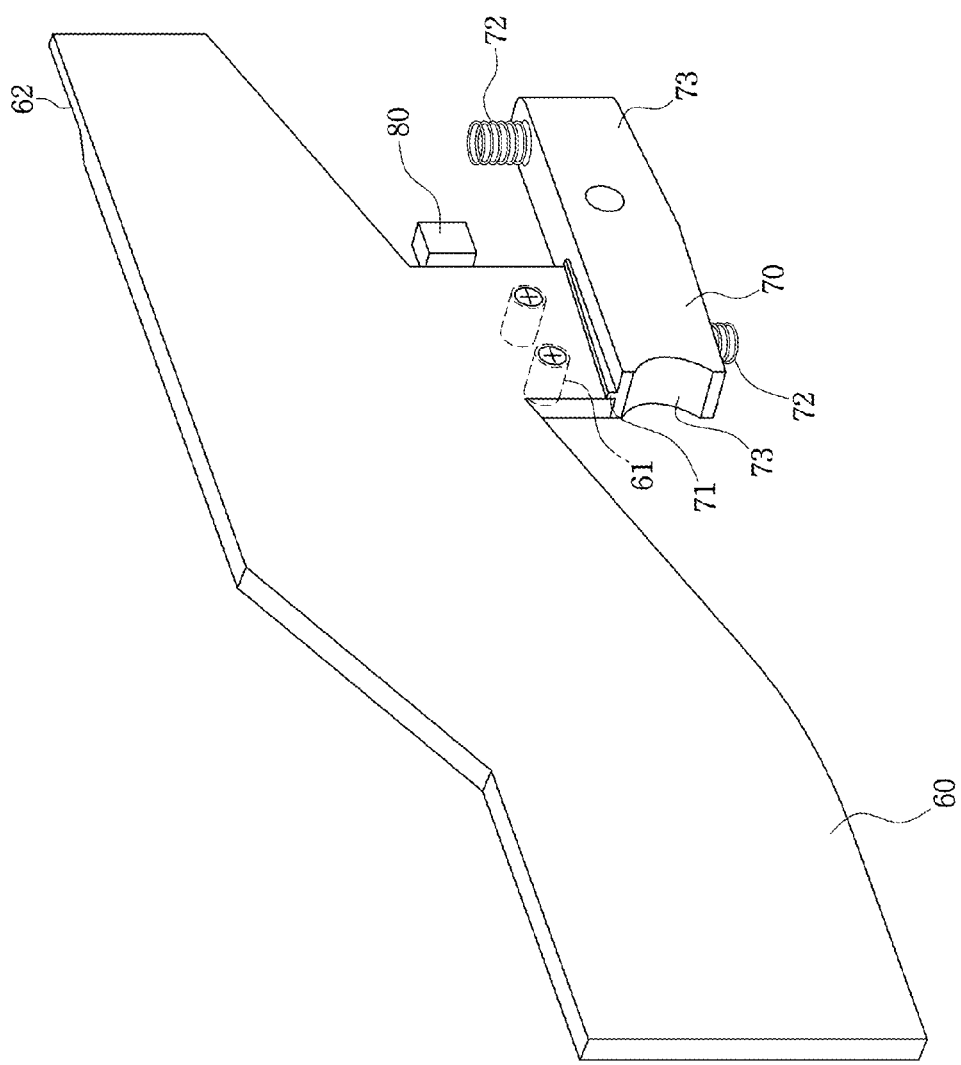
FIGS. 7 through 9 are perspective views illustrating operation of an accommodating section width adjustor installed in an accommodating section of a transfer path in a variable tape feeder according to an exemplary embodiment.
Figure 8:
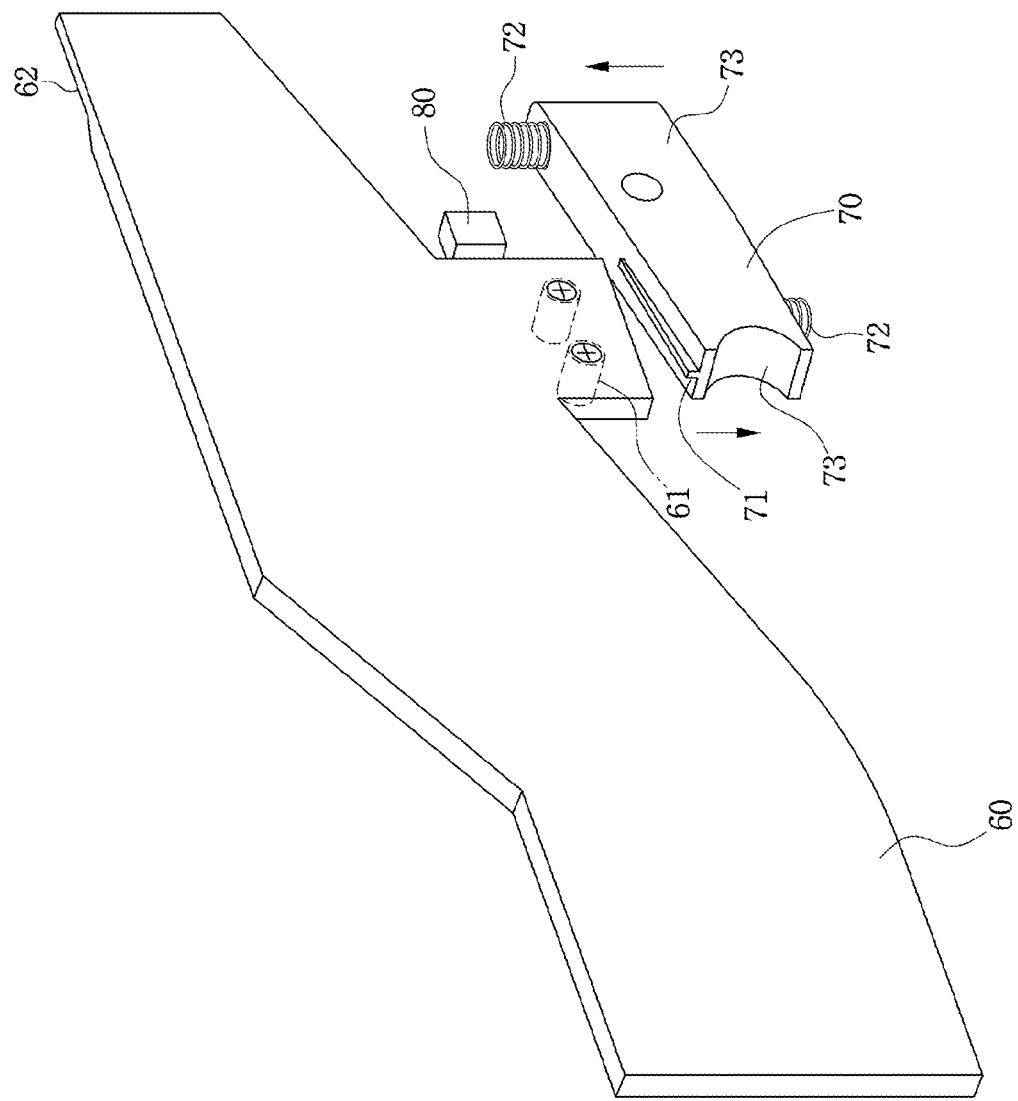
Figure 9:
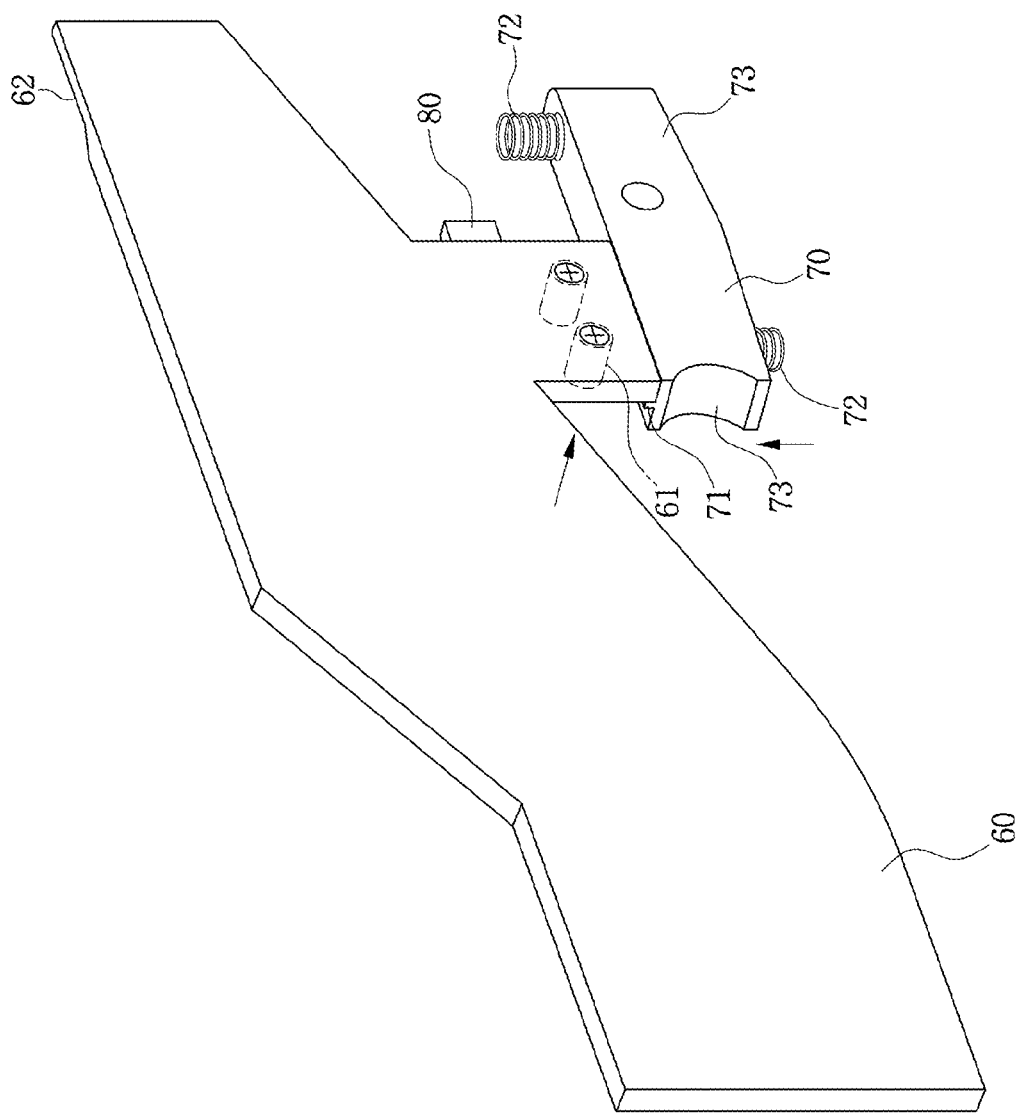

FIGS. 7 through 9 are perspective views illustrating operation of an accommodating section width adjustor installed in an accommodating section of a transfer path in a variable tape feeder according to an exemplary embodiment.

Figure 10:
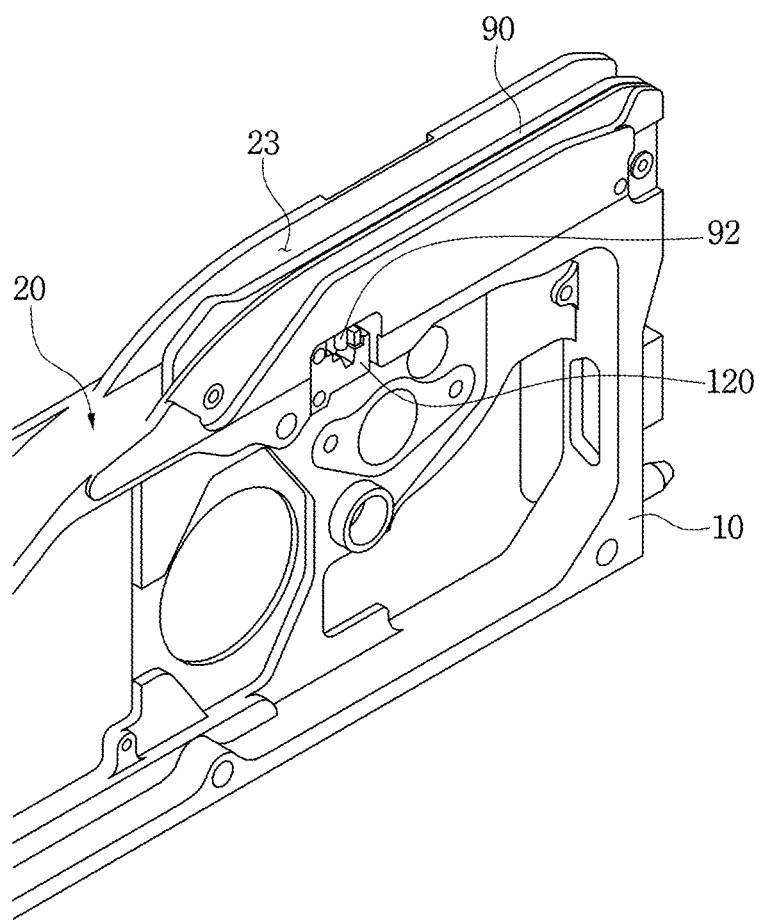
FIG. 10 is a perspective view of a component feeding section of a transfer path in a variable tape feeder according to an exemplary embodiment.
Figure 11:
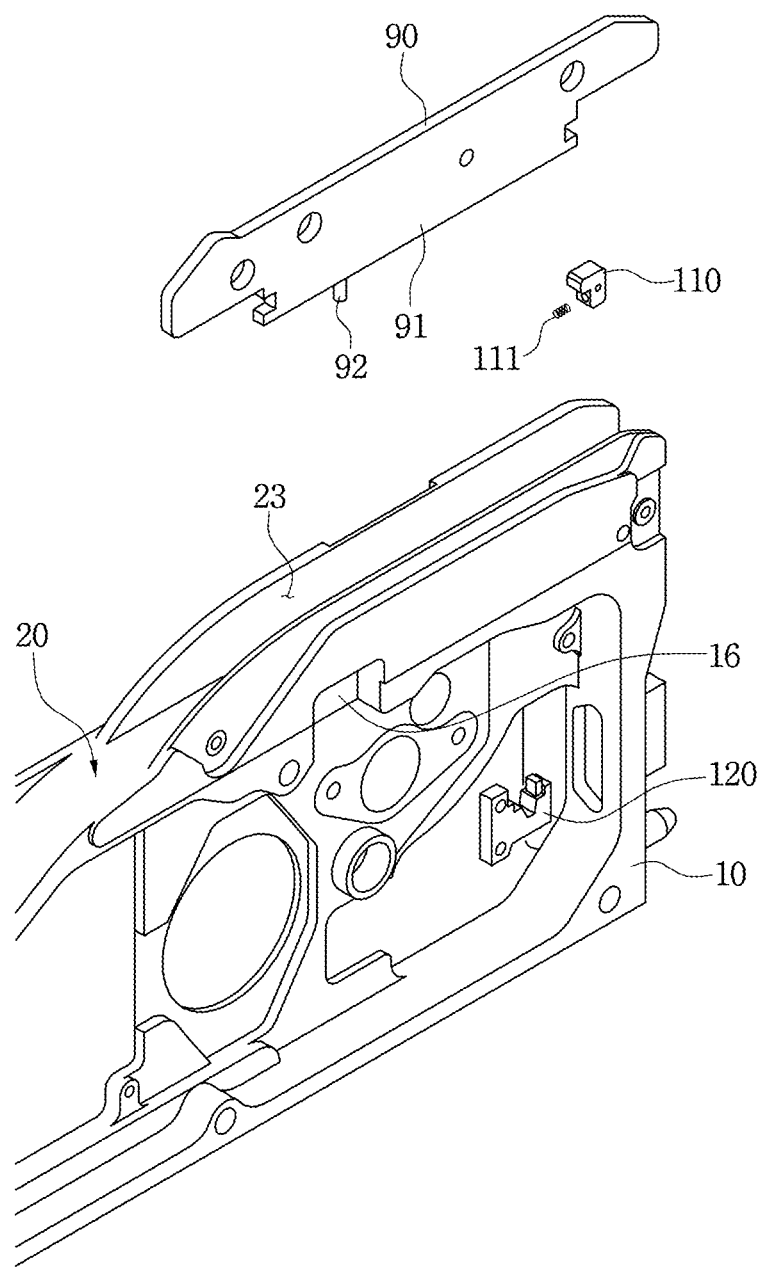
FIG. 11 is an exploded perspective view of the component feeding section of FIG. 10.
Figure 12:
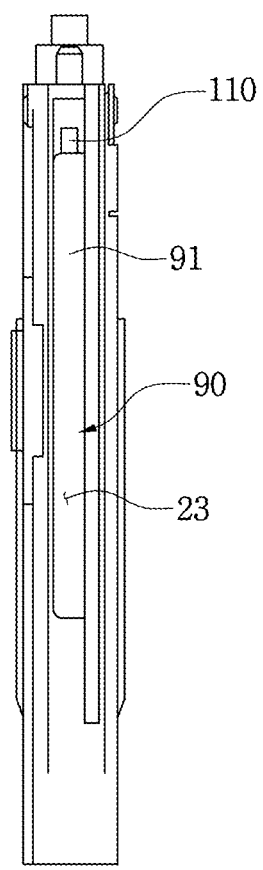
FIG. 12 is a plan view of the component feeding section of FIG. 10.
Figure 13:
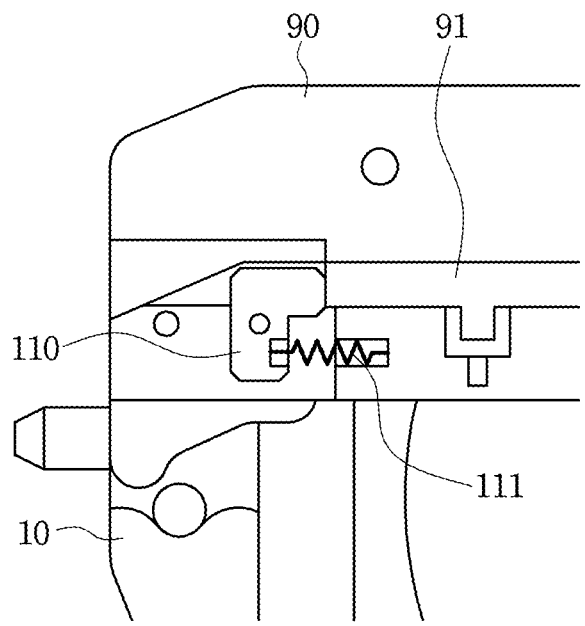
FIG. 13 is a left side view illustrating a fastened state of a component feeding section width adjuster in a variable tape feeder according to an exemplary embodiment.
Figure 14:
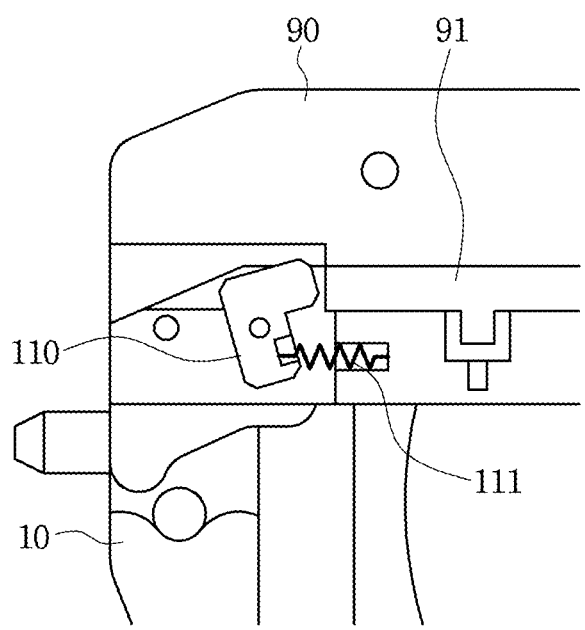
FIG. 14 is a right side view illustrating a detected state of a component feeding section width adjuster in a variable tape feeder according to an exemplary embodiment.

FIG. 10 is a perspective view of a component feeding section of a transfer path in a variable tape feeder according to an exemplary embodiment. FIGS. 11 and 12 are an exploded perspective view and a plan view of FIG. 10. FIG. 13 is a left side view illustrating a fastened state of a component feeding section width adjuster in a variable tape feeder according to an exemplary embodiment. FIG. 14 is a right side view illustrating a detected state of a component feeding section width adjuster in a variable tape feeder according to an exemplary embodiment.

Figure 15:
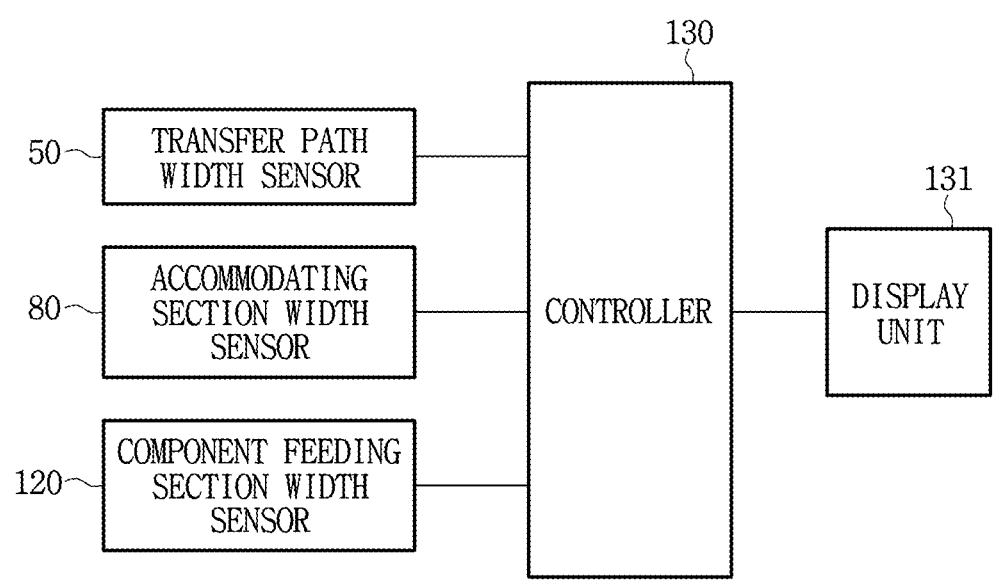
FIG. 15 is a block diagram illustrating a process of controlling a variable tape feeder according to an exemplary embodiment.

FIG. 15 is a block diagram illustrating a process of controlling a variable tape feeder according to an exemplary embodiment.

As illustrated in FIGS. 1 through 6 and 12, a variable tape feeder 100 according to an exemplary embodiment includes a frame 10 in which a transfer path 20 is formed to be able to transfer a carrier tape (not shown). The transfer path 20 is formed as a channel having a predetermined width and a predetermined depth in one lateral face of the frame. The frame 10 is provided with a cover (not shown) to be able to cover an open side of the transfer path 20.

The frame 10 is coupled with a reel, on which the carrier tape is wound, at a front lower portion thereof (left side of FIG. 2). The carrier tape wound on the reel can be transferred at a predetermined speed or at intervals of a predetermined time.

Thus, the transfer path 20 includes a carrier tape entry section 21 at the front lower portion of the frame 10 (left side of FIG. 2), a component feeding section 23 at a rear upper portion of the frame 10 (right side of FIG. 2) to be able to feed components of the carrier tape guided through the carrier tape entry section 21, and an accommodating section 22, into which a cover tape removed from the carrier tape at the component feeding section 23 is accommodated, on a cover tape discharge side thereof.

The cover tape, which is removed from the carrier tape at the component feeding section 23, is guided upwards and is accommodated into the accommodating section 22 by first and second rotators (not shown) installed at an upper middle portion of the frame 10. After the components of the carrier tape are fed at the component feeding section 23, the carrier tape is guided downwards via an upper right-hand end of the frame 10 to be cut or accommodated for disposal.

A transfer path width adjuster 30 is installed on the transfer path 20 to adjust a width of the transfer path 20 to a width of the carrier tape. A transfer path width sensor 50 for detecting the position of the transfer path width adjuster 30 is installed adjacent to the transfer path width adjuster 30.

In FIGS. 1 through 7, the transfer path width adjuster 30 is shown to be installed in the carrier tape entry section 21, but it is not limited to this position. Thus, the transfer path width adjuster 30 may be installed on the transfer path 20, and particularly on the component feeding section 23 or the accommodating section 22 into which the cover tape is accommodated. In addition, the transfer path width adjuster 30 may be installed in front of or behind the component feeding section 23, or between the carrier tape entry section 21 and the component feeding section 23.

As shown in FIGS. 1 and 4-6, the transfer path width adjuster 30 is installed parallel to the transfer path 20 in the form of a plate having a predetermined thickness, and adjusts the width of the transfer path 20 at the position of the transfer path width adjuster 30. The transfer path width sensor 50 detects the position of the transfer path width adjuster 30, and determines the resulting current width of the transfer path.

The transfer path width adjuster 30 is coupled to one side of the frame 10 to which the transfer path 20 is open. The transfer path width adjuster 30 has a shape corresponding or similar to a profile of the transfer path 20, on which the transfer path width adjuster 30 is to be installed. The transfer path width adjuster 30 is provided with a first guide section 32 having a predetermined inclination such that the carrier tape can be guided into the carrier tape entry section 21 (i.e., the upstream portion of the transfer path).

The transfer path width adjuster 30 has a thickness smaller than a variable width to be adjusted. The transfer path width adjuster 30 is provided with at least one first guide protrusion 31 extending in a widthwise direction perpendicular to a transferring direction of the tape, and displaceable in the widthwise direction relative to the frame 10. The first guide protrusion 31 employs a pin or shaft having a circular cross section or a polygonal cross section such as a triangular, quadrilateral, pentagonal, hexagonal, or octagonal cross section, but the shape of the cross section is not limited thereto.

As shown in FIG. 3, the frame 10 is provided with a first guide hole 11 extending in a widthwise direction such that the first guide protrusion 31 can be inserted into the first guide hole 11. The first guide protrusion 31 is slidably inserted into the first guide hole 11, so that the transfer path width adjuster 30 is displaceable in the frame 10 in the widthwise direction. There may be two or more of the first guide hole 11 and of the first guide protrusion 31 to prevent the transfer path width adjuster 30 from pivoting when the first guide protrusion 31 slides. The exemplary embodiment of FIGS. 1-3 illustrates two of each of the first guide hole 11 and first guide protrusion 31.

As shown in FIGS. 2-5, the transfer path width adjuster 30 cooperates with a first position determining member 40 for positioning a widthwise position such that the transfer path width adjuster 30 can be fixed at a predetermined position when sliding. Here, the first position determining member 40 has the shape of a rod having a predetermined length, and is hinged to the frame 10 to be pivoted within a limited angle.

As best illustrated in FIG. 5, the first position determining member 40 is provided with a first positioning protrusion 41 parallel to the transfer path 20 on a top surface thereof in front of a hinge shaft thereof, so that the transfer path width adjuster 30 sliding in the widthwise direction can be contacted and stopped at a predetermined position. The first positioning protrusion 41 is formed to correspond to the variable width of the transfer path 20.

As illustrated in FIG. 4, when the transfer path width adjuster 30 is located on the left side of the first positioning protrusion 41 of the first position determining member 40, the transfer path 20 has a narrow width to be able to correspond to a narrow carrier tape. In contrast, as illustrated in FIG. 6, when the transfer path width adjuster 30 is located on the right side of the first positioning protrusion 41 of the first position determining member 40, the transfer path 20 has a wide width to be able to correspond to a wide carrier tape. Here, a sum of thicknesses of the first positioning protrusion 41 of the first position determining member 40 and the transfer path width adjuster 30 is smaller than the variable width of the transfer path 20.

As shown in FIGS. 2-6, the first position determining member 40 is provided with a first elastic member 42 providing elasticity on the top surface thereof behind the hinge shaft thereof to be in contact with the transfer path width adjuster 30 with a predetermined elastic force. Thus, when the first position determining member 40 overcomes the elasticity of the first elastic member 42 to separate the first positioning protrusion 41 from the transfer path width adjuster 30, the transfer path width adjuster 30 can be displaced in the widthwise direction.

Although the first elastic member 42 has been described to be installed on the top surface of the first position determining member 40 behind the hinge shaft of the first position determining member 40, it is not limited to this configuration. Thus, the first elastic member 42 may be installed on the bottom surface of the first position determining member 40 in front of the hinge shaft of the first position determining member 40. The first position determining member 40 includes a first handle 43 having the shape of a recess or a protrusion in front of or behind the hinge shaft of the first position determining member 40 to be pivoted about the hinge shaft of the first position determining member 40, as shown in FIGS. 3-6.

Thus, when the first position determining member 40 is pressed downwards to be pivoted about its hinge shaft as illustrated in FIG. 5, the transfer path width adjuster 30 is separated from the first position determining member 40, so that the width of the transfer path 20 is adjustable by sliding the transfer path width adjuster 30 inserted into the first guide hole 11 in a direction to be adjusted as illustrated in FIG. 6. When released at a position to be adjusted, the first position determining member 40 is pivoted upwards to come into contact with the transfer path width adjuster 30.

Alternatively, the transfer path width adjuster 30 may be that adjusts the width of the transfer path 20 as soon as it is coupled to the transfer path 20. The transfer path width adjuster 30 is coupled to the sidewall of the transfer path 20 at the same thickness as the variable width to be adjusted, so that the remaining width of the transfer path 20 can be automatically adjusted to correspond to the width of the carrier tape.

The transfer path width adjuster 30 is integrally formed with the cover (not shown) covering the transfer path 20, so that the width of the transfer path 20 can be adjusted by detaching the cover.

As shown in FIGS. 1-3, the transfer path width sensor 50 is installed on the frame 10, and detects the position of the transfer path width adjuster 30. Here, since two carrier tapes having different widths are compatible with the same tape feeder, the transfer path width sensor 50 detects at which position the transfer path width adjuster 30 is located according to the first positioning protrusion 41 of the first position determining member 40.

To easily detect the transfer path width adjuster 30 that is displaced relative to the transfer path width sensor 50, the transfer path width sensor 50 may be provided with a probe protruding toward the transfer path width adjuster 30 if necessary.

As shown in FIG. 3, the frame 10 is provided with a first installing section 12 in which the transfer path width adjuster 30, the first position determining member 40, and the transfer path width sensor 50 can be installed. The first installing section 12 has a predetermined space to be connected to the transfer path 20 of the frame 10. The transfer path width adjuster 30 is placed across the transfer path 20 and first installing section 12, and the first position determining member 40 is located under the transfer path width adjuster 30. A predetermined space is provided under the first position determining member 40 for pivoting of the first position determining member 40.

The first guide protrusion 31 of the transfer path width adjuster 30 is fitted into the first installing section 12. Similarly, the first guide hole 11 into which the first guide protrusion 31 is inserted is also formed in the first installing section 12. The first installing section 12 can be partitioned into a position determining member installing section in which the transfer path width adjuster 30 and the first position determining member 40 are located, and a sensor installing section in which the transfer path width sensor 50 is installed.

A controller 130 receives a signal detected by the transfer path width sensor 50 and displays the position of the transfer path width adjuster 30 and the current width of the carrier tape according to their detection on a display unit 131 at a position that can be checked by a worker, that is, in front of the frame 10. The controller 130 can also output an alarm.

As illustrated in FIGS. 1, 2, 3 and 7, the variable tape feeder according to an exemplary embodiment includes an accommodating section width adjuster 60 installed in the accommodating section 22 to adjust a width of the accommodating section 22, into which the cover tape removed from the carrier tape is accommodated, on the transfer path 20. This accommodating section width adjuster 60 is configured similarly to the transfer path width adjuster 30 installed in the carrier tape entry section 21.

The accommodating section 22 of the frame 10 has a predetermined space into which the cover tape removed from the carrier tape is guided and accommodated. A door for discharging the cover tape is provided on the cover tape discharge side.

As illustrated in FIGS. 1-3 and 7-9, the accommodating section 22 is provided with an accommodating section width adjuster 60, which adjusts a width of the accommodating section 22 of the transfer path 20 according to the width of the cover tape to thereby prevent an excessive load from being applied to the first and second rotators in case the cover tape is entangled and/or fails to be smoothly discharged toward the door. An accommodating section width sensor 80 for detecting adjustment of the accommodating section width adjuster 60 is installed adjacent to the accommodating section width adjuster 60.

As best shown in FIGS. 7-9, the accommodating section width adjuster 60 is installed parallel to the transfer path 20 in the form of a plate having a predetermined thickness, and adjusts the width of the accommodating section 22 at the position of the accommodating section width adjuster 60. The accommodating section width sensor 80 detects the position of the accommodating section width adjuster 60.

The accommodating section width adjuster 60 is coupled to one side of the frame 10 to which the accommodating section 22 is open. The accommodating section width adjuster 60 has a shape corresponding or similar to a profile of the accommodating section 22. The accommodating section width adjuster 60 is provided with a second guide section 62 having a predetermined inclination such that the cover tape can be guided into the accommodating section 22 (i.e., the upstream portion of a transferring direction of the cover tape).

The accommodating section width adjuster 60 has a thickness smaller than a variable width to be adjusted. The accommodating section width adjuster 60 is provided with at least one second guide protrusion 61 extending in a widthwise direction perpendicular to the transferring direction of the tape and displaceable in the widthwise direction relative to the frame 10. The second guide protrusion 61 employs a pin or shaft having a circular cross section or a polygonal cross section such as a triangular, quadrilateral, pentagonal, hexagonal, or octagonal cross section, but the shape of the cross section is not limited thereto.

As shown in FIG. 3, the frame 10 is provided with a second guide hole 13 extending in a widthwise direction such that the second guide protrusion 61 can be inserted into the second guide hole 13. Thus, the second guide protrusion 61 is slidably inserted into the second guide hole 13, so that the accommodating section width adjuster 60 can be displaced in the frame 10 in the widthwise direction. There may be two or more of the second guide hole 13 and of the second guide protrusion 61 to prevent the accommodating section width adjuster 60 from pivoting when the second guide protrusion 61 slides. The exemplary embodiment of FIGS. 7-9 illustrates two of each of the first guide hole 13 and first guide protrusion 61.

As shown in FIGS. 7-9, the accommodating section width adjuster 60 cooperates with a second position determining member 70 for positioning a widthwise position such that the accommodating section width adjuster 60 can be fixed at a predetermined position when sliding. Here, the second position determining member 70 has the shape of a rod having a predetermined length, and is hinged to the frame 10 to be pivoted within a limited angle.

As best shown in FIG. 8, the second position determining member 70 is provided with a second positioning protrusion 71 parallel to the transfer path 20 on a top surface thereof in front of a hinge shaft thereof, so that the accommodating section width adjuster 60 sliding in the widthwise direction can be contacted and stopped at a predetermined position. Here, the second positioning protrusion 71 is formed to correspond to the variable width of the accommodating section width adjuster 60.

As illustrated in FIG. 7, when the accommodating section width adjuster 60 is located on the left side of the second positioning protrusion 71 of the second position determining member 70, the accommodating section 22 has a narrow width to be able to correspond to a narrow cover tape. In contrast, as illustrated in FIG. 9, when the accommodating section width adjuster 60 is located on the right side of the second positioning protrusion 71 of the second position determining member 70, the accommodating section 22 has a wide width to be able to correspond to a wide cover tape. A sum of thicknesses of the second positioning protrusion 71 of the second position determining member 70 and the accommodating section width adjuster 60 is smaller than the variable width.

As shown in FIGS. 2 and 7-9, the first position determining member 40 is provided with a second elastic member 72 providing elasticity on the top surface thereof behind the hinge shaft thereof to be in contact with the accommodating section width adjuster 60 with a predetermined elastic force. Thus, when the second position determining member 70 overcomes the elasticity of the second elastic member 72 to separate the second positioning protrusion 71 from the accommodating section width adjuster 60, the accommodating section width adjuster 60 can be displaced in the widthwise direction.

Although the second elastic member 72 has been described to be installed on the top surface of the second position determining member 70 behind the hinge shaft of the second position determining member 70, it is not limited to this configuration. Thus, the second elastic member 72 may be installed on the bottom surface of the second position determining member 70 in front of the hinge shaft of the second position determining member 70. As illustrated in FIGS. 7-9, the second position determining member 70 includes a second handle 73 having the shape of a recess or a protrusion in front of or behind the hinge shaft of the second position determining member 70 to be pivoted about the hinge shaft of the second position determining member 70.

Further, as shown in FIG. 2, an operating recess 15 into which a finger of the worker or a tool can be inserted is formed in the lateral face of the frame 10 in order to pivot the second position determining member 70 and displace the accommodating section width adjuster 60. The accommodating section width adjuster 60 and the second position determining member 70 are partially exposed from the operating recess 15. The second handle 73 of the second position determining member 70 may also be exposed from the operating recess 15.

In the state illustrated in FIG. 7, when the second position determining member 70 is pressed downwards to be pivoted about its hinge shaft as illustrated in FIG. 8, the accommodating section width adjuster 60 is separated from the second position determining member 70, so that the width of the accommodating section 22 is adjustable by sliding the second positioning protrusion 71 of the accommodating section width adjuster 60 along the second guide hole 13 to move the accommodating section width adjuster 60 in a direction to be adjusted, i.e., a direction perpendicular to the transferring direction of the tape. When released at a position to be adjusted, the second position determining member 70 is pivoted upwards to come into contact with the accommodating section width adjuster 60 by the second elastic member 72.

Alternatively, the accommodating section width adjuster 60 may be configured to adjust the width of the accommodating section 22 as soon as it is coupled to the accommodating section 22. The accommodating section width adjuster 60 may be coupled to the sidewall of the accommodating section 22 at the same thickness as the variable width to be adjusted, so that the remaining width of the accommodating section 22 can be automatically adjusted to correspond to the width of the cover tape.

The accommodating section width sensor 80 is installed on the frame 10, and detects the position of the accommodating section width adjuster 60. The accommodating section width sensor 80 detects at which position the accommodating section width adjuster 60 is located according to the second positioning protrusion 71 of the second position determining member 70. To easily detect the accommodating section width adjuster 60 that is displaced relative to the accommodating section width sensor 80, the accommodating section width sensor 80 may be provided with a probe protruding toward the accommodating section width adjuster 60.

The frame 10 is provided with a second installing section 14 in which the accommodating section width adjuster 60, the second position determining member 70, and the accommodating section width sensor 80 can be installed. The second installing section 14 has a predetermined space to be connected to the accommodating section 22 of the frame 10. Thus, the accommodating section width adjuster 60 is placed across the accommodating section 22 and second installing section 14, and the second position determining member 70 is located under the accommodating section width adjuster 60. A predetermined space is provided under the second position determining member 70 for pivoting of the second position determining member 70.

Thus, the second guide protrusion 61 of the accommodating section width adjuster 60 is fitted into the second installing section 14. Similarly, the second guide hole 13 into which the second guide protrusion 61 is inserted is also formed in the second installing section 14. The second installing section 14 can be partitioned (not shown) into a position determining member installing section in which the accommodating section width adjuster 60 and the second position determining member 70 are located, and a sensor installing section in which the accommodating section width sensor 80 is installed.

As shown in FIG. 15, a controller 130 is provided to receive a signal detected by the accommodating section width sensor 80 and transmitted to the controller 130. The controller 130 displays the position of the transfer path width adjuster 30 and the current width of the carrier tape, according to the respective detections, on the display unit 131 at a position that can be checked by a worker, for example, in front of the frame 10. The controller 130 can also output an alarm.

The controller 130 determines whether the widths of the transfer path 20, the accommodating section 22, and the component feeding section 23 are equal to each other in response to the signals detected by the transfer path width sensor 50 and the accommodating section width sensor 80, and can display results of the determination together.

As illustrated in FIGS. 10 through 15, the variable tape feeder according to an exemplary embodiment includes a component feeding section width adjuster 90 installed in the component feeding section 23 to adjust a width of the component feeding section 23 feeding components held in the carrier tape from which the As shown in FIG. 1, the, the frame 10 includes the component feeding section 23 of the transfer path 20, which feeds the components that can be fed by the component mounter (not shown) after the cover tape is removed from the carrier tape guided to downstream of the transfer path, and the component feeding section width adjuster 90 that adjusts a width of the component feeding section 23 of the transfer path 20 according to the width of the carrier tape. A component feeding section width sensor 120 detecting adjustment of the component feeding section width adjuster 90 is installed adjacent to the component feeding section width adjuster 90, as illustrated in FIGS. 1, 2, and 10-15.

As best shown in FIGS. 11 and 12, the component feeding section width adjuster 90 is installed parallel to the transfer path 20 in the form of a plate having a predetermined thickness, and adjusts the width of the component feeding section 23 at the position of the component feeding section width adjuster 90. The component feeding section width sensor 120 detects the position of the component feeding section width adjuster 90. The component feeding section width adjuster 90 is installed in the component feeding section 23 of the frame 10, and is provided with a fixing section 91, a bottom surface of which is flat to be fixed to the component feeding section 23.

The component feeding section 23 is provided with a locking member 110 that fixes the fixing section 91 in close contact with the bottom surface of the component feeding section 23. The locking member 110 is configured to apply a force to one side of the fixing section 91 wherein the other side of the fixing section 91 is in close contact with a surface of the component feeding section 23. The locking member 110 is coupled with a locking elastic member 111 providing elasticity to lock the fixing section 91 of the component feeding section width adjuster 90 with a predetermined elastic force. The locking member 110 is pivotably hinged to the frame 10.

The locking member 110 has the form of a hook, wherein an end of the fixing section 91 can be guided to, inserted into and hooked on to the locking member 110. To this end, the fixing section 91 is provided with a locking recess for insertion of the locking member 110.

The component feeding section width adjuster 90 has a thickness equal to or less than a variable width to be adjusted. Thus, when the width of the component feeding section 23 is to be varied, the component feeding section width adjuster 90 is simply mounted to narrow the width of the component feeding section 23 to correspond to a narrow carrier tape. The component feeding section width adjuster 90 is removed to widen the width of the component feeding section 23 to correspond to a wide carrier tape.

As shown in FIGS. 11, 13, and 14, the component feeding section width adjuster 90 of the component feeding section 23 has a detecting knob 92 protruding toward the component feeding section width sensor 120. The component feeding section width sensor 120 is installed below the component feeding section width adjuster 90, and detects the component feeding section width adjuster 90 through the detection knob 92, as shown in FIGS. 13 and 14.

As illustrated in FIG. 11, the frame 10 is provided with a third installing section 16 in which the component feeding section width sensor 120 can be installed. The third installing section 16 has a predetermined space to be connected to the component feeding section 23 of the frame 10. The detection knob 92 of the component feeding section width adjuster 90 can be inserted into the third installing section 16.

As shown in FIG. 15, the controller 130, to which a signal detected by the component feeding section width sensor 120 is transmitted, displays a position of the component feeding section width adjuster 90, determined based on the detected signal, on the display unit 131, and a current width of the carrier tape. The controller 130 can also output an alarm.

The controller 130 determines whether the widths of the transfer path 20, the accommodating section 23, and the component feeding section 22 are equal to each other in response to the signals detected by the transfer path width sensor 50, accommodating section width sensor 80, and component feeding section width sensor 120, and outputs an error when one of them is different from the others.

Although the technical principal of the variable tape feeder has been described in connection with the accompanying drawings, it will be apparent that these are merely illustrative of, and not limiting to, the exemplary embodiments.

According to exemplary embodiments, a variable tape feeder can adjust widths of the transfer path 20 formed therein, the component feeding section 23 and the accommodating section 22 provided on the transfer path 20, so that it can employ various carrier tapes having different widths to improve compatibility.

Further, the variable tape feeder can detect adjustment of the widths to determine whether the widths are equal to each other, and output a result of the determination, to enable a worker to easily discover an error in adjustment.

In addition, when the widths are adjusted, the variable tape feeder allows the position determining member to be readily separated from the locking member, to improve convenience of the width adjustment.

While exemplary embodiments have been disclosed for illustrative purposes, those skilled in the art will appreciate that various modifications, additions and substitutions are possible without departing from the spirit and scope of the invention as defined by the accompanying claims.

What is claimed is:

1. A variable tape feeder for feeding a tape including a carrier tape, a plurality of components packaged on the carrier tape, and a cover tape disposed over the components, the variable tape feeder comprising:
    a frame including a transfer path that transfers the carrier tape along a transferring direction;
    a transfer path width adjuster that is installed perpendicular to a bottom of the transfer path and directly on the bottom of the transfer path to adjust a width of the transfer path according to a width of the carrier tape;
    a transfer path width sensor that detects a width adjustment of the transfer path width adjuster under the transfer path width adjuster; and
    a controller that receives a signal indicative of the detected width adjustment from the transfer path width sensor and outputs the width adjustment in response to the signal,
    wherein the transfer path width adjuster includes a first position determining member that determines a position of the transfer path width adjuster according to the width adjustment, and
    wherein the first position determining member is pivotable relative to the frame, and includes:
    a first positioning protrusion extending in the transferring direction on one side of the first position determining member and in contact with the transfer path width adjuster, and
    a first elastic member providing elasticity disposed on another side of the first position determining member to keep the transfer path width adjuster positioned.

2. The variable tape feeder of claim 1, wherein the transfer path width adjuster comprises a plate having a predetermined thickness and adjusts the width of the transfer path according to a fixed position, and the transfer path width sensor detects a position of the transfer path width adjuster to detect the width adjustment.

3. The variable tape feeder of claim 1, wherein the transfer path width adjuster includes at least one first guide protrusion extending in a widthwise direction of the transfer path perpendicular to the transferring direction, and the frame includes at least one first guide hole into which the first guide protrusion is slidably inserted in the widthwise direction.

4. The variable tape feeder of claim 1, wherein the frame includes a first installing section defined by a recess on the transfer path, and the first position determining member and the transfer path width sensor are installed in the first installing section adjacent to the transfer path.

5. A variable tape feeder for feeding a tape including a carrier tape, a plurality of components packaged on the carrier tape, and a cover tape disposed over the components, the variable tape feeder comprising:
    a frame including a transfer path that transfers the carrier tape along a transferring direction, and an accommodating section;
    an accommodating section width adjuster that is installed and overlapped perpendicular to a bottom of the transfer path in the accommodating section to adjust a width of the accommodating section according to a width of the cover tape;
    an accommodating section width sensor that detects a width adjustment of the accommodating section width adjuster under the accommodating section width adjuster; and
    a controller that receives a signal indicative of the detected width adjustment from the accommodating section width sensor and outputs the width adjustment in response to the signal,
    wherein the accommodating section width adjuster includes a second position determining member that determines a position of the accommodating section width adjuster according to the width adjustment, and
    wherein the second position determining member is pivotable relative to the frame, and includes:
    a second positioning protrusion extending in the transferring direction on one side of the second position determining member and in contact with the accommodating section width adjuster, and
    a second elastic member providing elasticity on another side of the second position determining member to keep the accommodating section width adjuster positioned.

6. The variable tape feeder of claim 5, wherein the accommodating section width adjuster comprises a plate having a predetermined thickness and adjusts the width of the accommodating section according to a fixed position, and the accommodating section width sensor detects a position of the accommodating section width adjuster to detect the width adjustment.

7. The variable tape feeder of claim 5, wherein the accommodating section width adjuster includes at least one second guide protrusion extending in a widthwise direction of the accommodating section perpendicular to the transferring direction, and the frame includes at least one second guide hole into which the second guide protrusion is slidably inserted in the widthwise direction.

8. The variable tape feeder of claim 5, wherein the frame includes a second installing section defined by a recess in the accommodating section, and the second position determining member and the accommodating section width sensor are installed in the second installing section adjacent to the accommodating section.

9. A variable tape feeder for feeding a tape including a carrier tape, a plurality of components packaged on the carrier tape, and a cover tape disposed over the components, the variable tape feeder comprising:
  a frame including a transfer path that transfers the carrier tape along a transferring direction, and a component feed section;
  a component feeding section width adjuster that is installed perpendicular to a bottom of the transfer path and directly on the bottom of the transfer path in the component feeding section to adjust a width of the component feeding section according to a width of the carrier tape;
  a component feeding section width sensor that detects a width adjustment of the component feeding section width adjuster under the component feeding section width adjuster; and
  a controller that receives a signal indicative of the detected width adjustment from the component feeding section width sensor and outputs the width adjustment in response to the signal,
  wherein the component feeding section width adjuster includes a first position determining member that determines a position of the component feeding section width adjuster according to the width adjustment, and
  wherein the first position determining member is pivotable relative to the frame, and includes:
  a first positioning protrusion extending in the transferring direction on one side of the first position determining member and in contact with the component feeding section width adjuster, and
  a first elastic member providing elasticity disposed on another side of the first position determining member to keep the component feeding section width adjuster positioned.

10. The variable tape feeder of claim 9, wherein the component feeding section width adjuster comprises a plate having a predetermined thickness and adjusts the width of the component feeding section according to a fixed position, and the component feeding section width sensor detects a position of the component feeding section width adjuster to detect the width adjustment.

11. The variable tape feeder of claim 9, wherein the component feeding section width adjuster is in contact with an inner sidewall of the component feeding section, and the width adjustment of the component feeding section is determined based on a thickness of the component feeding section width adjuster.

12. The variable tape feeder of claim 9, wherein the frame includes a third installing section defined by a recess on the transfer path, and the component feeding section width sensor is installed in the third installing section.

13. The variable tape feeder of claim 9, wherein the component feeding section width adjuster includes a fixing section including a flat bottom surface, and the frame includes at least one locking member that engages the fixing section of the component feeding section width adjuster to prevent removal of the component feeding section width adjuster.

14. The variable tape feeder of claim 13, wherein the fixing section of the component feeding section width adjuster includes a locking recess in which the locking member is disposed.

15. The variable tape feeder of claim 13, wherein the locking member includes a hook, and a locking elastic member providing a predetermined elastic force to the locking member.

16. A variable tape feeder for feeding a tape including a carrier tape, a plurality of components packaged on the carrier tape, and a cover tape disposed over the components, the variable tape feeder comprising:
  a frame including a transfer path that transfers the carrier tape along a transferring direction, an accommodating section that accommodates the cover tape which is removed from the carrier tape before the components are fed, and a component feeding section that feeds the components to a component mounter;
  a transfer path width adjuster that is installed perpendicular to a bottom of the transfer path and immediately on the bottom of the transfer path to adjust a width of the transfer path according to a width of the carrier tape;
  a transfer path width sensor that detects a transfer path width adjustment of the transfer path width adjuster under the transfer path width adjuster;
  an accommodating section width adjuster installed and overlapped perpendicular to the bottom of the transfer path in the accommodating section to adjust a width of the accommodating section according to a width of the cover tape;
  an accommodating section width sensor that detects an accommodating section width adjustment of the accommodating section width adjuster under the accommodating section width adjuster;
  a component feeding section width adjuster installed perpendicular to the bottom of the transfer path and immediately on the bottom of the transfer path in the component feeding section to adjust a width of the component feeding section according to a width of the carrier tape;
  a component feeding section width sensor that detects a component feeding section width adjustment of the component feeding section width adjuster under the component feeding section width adjuster; and
  a controller that receives a signal indicative of the transfer path width adjustment from the transfer path width sensor, a signal indicative of the accommodating section width adjustment from the accommodating section width sensor, and a signal indicative of the component feeding section width adjustment from the component feeding section width sensor, and outputs the transfer path width adjustment, the accommodating section width adjustment, and the component feeding section width adjustment in response to the signals, wherein the transfer path width adjuster includes a first position determining member that determines a position of the transfer path width adjuster according to the width adjustment, and wherein the first position determining member is pivotable relative to the frame, and includes:

a first positioning protrusion extending in the transferring direction on one side of the first position determining member and in contact with the transfer path width adjuster, and a first elastic member providing elasticity disposed on another side of the first determining member to keep the transfer path width adjuster positioned.

17. The variable tape feeder of claim 16, wherein the controller determines whether the widths of the transfer path, the accommodating section, and the component feeding section are equal to each other in response to the signals respectively detected by the transfer path width sensor, the accommodating section width sensor, and the component feeding section width sensor, and outputs results of the determination.

* * * * *